Jan. 17, 1967 N. SCHINK 3,298,875

METHOD FOR SURFACE TREATMENT OF SEMICONDUCTOR ELEMENTS

Filed June 5, 1963

United States Patent Office 3,298,875

Patented Jan. 17, 1967

3,298,875

METHOD FOR SURFACE TREATMENT OF SEMICONDUCTOR ELEMENTS

Norbert Schink, Erlangen, Germany, assignor to Siemens-Schuckertwerke Aktiengesellschaft, Berlin - Siemensstadt, Germany, a corporation of Germany Filed June 5, 1963, Ser. No. 285,784

Claims priority, application Germany, June 20, 1962, S 79,992

3 Claims. (Cl. 148—6.3)

Figure 1:
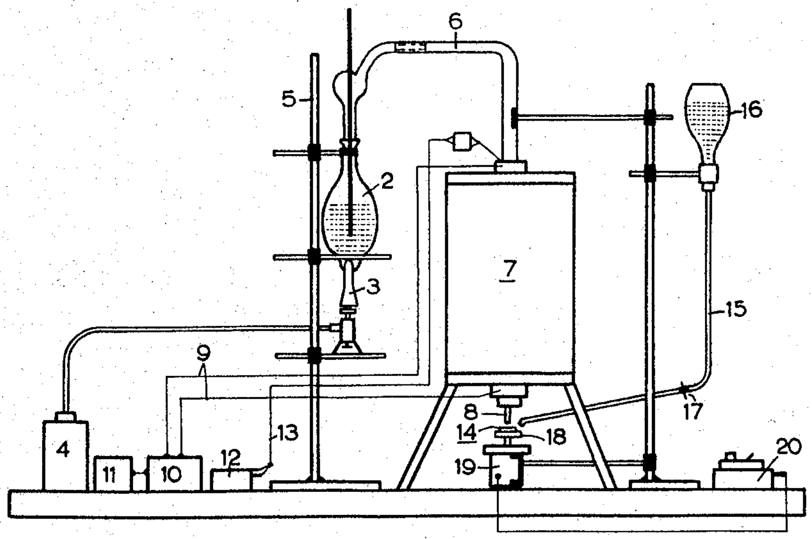

My invention relates to a method for surface treatment of a semiconductor element and particularly an element comprising a substantially monocrystalline semiconductor body having at least one metal electrode.

Semiconductor elements such as rectifiers, transistors, photo-diodes, and four-layer devices consist essentially of a monocrystalline body of a semiconductor material such as an element of the Fourth Group of the Periodic Table, or of an intermetallic compound of elements from the Third and Fifth or the Second and Sixth Groups of the Periodic Table, and possess electrodes applied thereto for instance by a diffusing or alloying process.

An oxide layer is desirable on the surface of such a semiconductor body for substantially preventing the penetration of foreign substances into the finished semiconductor body.

Furthermore, such oxide layers may serve for masking where semiconductor devices are obtained by diffusion processes. For this purpose an oxide layer or film is coated upon a semiconductor body consisting, for example, of germanium or silicon, and subsequently part of the oxide film is removed photomechanically, and suitable substances such as phosphorus or aluminum are diffused thereinto at increased temperatures. As a consequence of the initial masking, the doping substances will penetrate into the body only in those areas, where the body itself is exposed, while in other areas the oxide layer functions as impervious mask.

Also, oxide layers incorporating suitable doping substances may be coated upon a semiconductor body. It is then possible to diffuse these doping substances into the semiconductor material by means of appropriate thermal treatment. Furthermore, oxide films may be employed to remove defective layers from the surface of semiconductor bodies. For this purpose an oxide layer is first applied upon the semiconductor body and is subsequently removed, for instance, with the aid of hydrofluoric acid. The newly exposed surfaces will correspond substantially to the lattice planes of the semiconductor crystal.

A dense durable oxide layer may be formed upon a monocrystalline body of semiconductor material by subjecting the body to a thermal treatment in air or other oxygen-containing atmosphere. This may be accomplished by heating the semiconductor to a temperature of 600° C. and more, or at fairly high temperatures by utilizing steam. However this process could not heretofore be used for oxidizing finished alloyed semiconductor elements, because the electrodes alloyed into these elements melted at the required high temperatures.

It is an object of my invention to overcome the above-mentioned deficiencies.

According to a feature of my invention, I direct a heated jet of an axidizing flowing agent upon the semiconductor surface and another jet of a flowing cooling agent upon the electrode. The latter jet will cool the metal electrode, for instance, an indium plate or a gold-semiconductor eutectic, and thereby prevent its melting due to the temperatures of the hot jet. In applying the method of the present invention it has been found that the hot and cold jets simultaneously acting on the same semiconductor element one beside the other, will cause neither rupturing of the metal electrode due to thermal tension, nor cracks and fissures within the semiconductor material, nor any other damage.

According to another feature of my invention, I pass a jet of superheated steam across the semiconductor surface thereby to cause the formation of a suitable layer on those areas which are particularly to be protected, above all on those areas where the p-n junctions are exposed on the surface. In the case of semiconductor elements symmetrical about an axis I impart a rotational movement to the element while subjecting it to such treatment so that the jet of steam is passed across the semiconductor body along regular paths.

Figure 2:
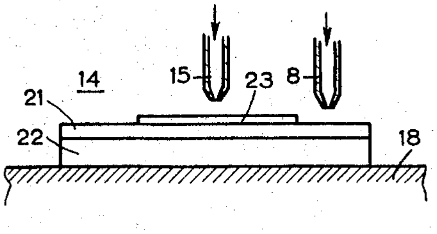

Other objects and advantages of the invention will become obvious from the following detailed description of embodiments thereof with reference to the accompanying drawings wherein:

FIG. 1 is a side elevation of a test apparatus as used in applying the method of the present invention; and FIG. 2 is a partial view of a detail of FIG. 1, drawn to an enlarged scale.

In FIG. 1 water within a quartz receptacle 2 is heated to generate steam by means of a Bunsen burner 3 which is supplied from a fuel gas cylinder 4. A supporting stand 5 holds both the receptacle 2 and the heating means 3. Quartz piping 6 passes the steam into a furnace 7, preferably an electric resistance furnace, superheating the steam. A silicon carbide (Silite) tube, located within said furnace 7, constitutes a heating conductor for the quartz piping 6 passing through the silicon carbide tube. Then the steam finally leaves the furnace 7 through a lower nozzle 8 which directs it toward a surface of a semiconductor element 14. Electric lines 9 establish the connection between the furnace 7 and a transformer 10 which, in turn, is supplied from a current source 11. Thermo-elements measure the temperature of the superheated steam within the furnace 7. A measuring instrument 12 is connected to said thermo-elements by a line 13.

At the same time a line 15 directs water coming from a receptacle 16 upon the surface of the semiconductor 14 through a line 15. A faucet 17 permits the interruption and regulation of the water flow. The semiconductor element 14 is secured upon a stainless steel or copper support 18 which is rapidly rotated by a motor 19 energized by a voltage source 20.

According to the present invention, as the semiconductor body is being treated a jet of hot steam flows out of the nozzle 8 and onto the semiconductor-body surface, consequently producing an oxide layer thereon. Distilled water passes through the line 15 and is directed upon a metal electrode on the surface of the semiconductor body, to prevent melting of the electrode. The receptacle 16 holding the distilled water may consist of polyethylene or other suitable synthetic plastic material as is commercially available in a degree of purity required for semiconductor engineering purposes. At the exit point of the nozzle 8 the superheated steam is at a temperature of approximately 600–700° C. The water in the receptacle 16 on the other hand, is at room temperature, namely at approximately 20° C.

FIG. 2 is an illustration of the semiconductor element 14 drawn to an enlarged scale. This semiconductor element is, for instance, a rectifier element which may be obtained as follows. An aluminum foil having a thickness of approximately 60 microns and a diameter of 19 mm. is placed upon a molybdenum disc having a diameter of about 20 mm. and a thickness of 2 mm. Then a silicon wafer having a thickness of approximately 300 microns and a diameter of 18 mm. is superimposed upon this aluminum foil. Subsequently a gold-antimony foil (0.5% Sb) having a diameter of about 15 mm. and a thickness of 50 microns is placed upon the silicon wafer. The entire assembly is then embedded, under pressure, within a powder substance which will not react with these component elements such as graphite powder, and is heated in a furnace to approximately 800° C.

After this alloying step the semiconductor element 14 comprises a silicon body 21 having two contact electrodes, namely a molybdenum disc 22, and a gold-silicon eutectic 23. After alloying the semiconductor surface may be subjected in a known manner to an etching and flooding process.

Subsequently, the semiconductor element 14 is clamped upon the supporting means 18 by suitable clamping members not shown. The nozzle 8 is located above the semiconductor surface, and possesses a nozzle aperture diameter in the order of 1.5 mm. The nozzle aperture is positioned at a distance of approximately 1 mm. from the semiconductor element. In a test process the superheated steam leaving the nozzle had a temperature of 630° C. After the semiconductor element had been treated in this manner for a period of approximately 30 minutes, an oxide layer having a thickness of several hundred angstroms was obtained on the semiconductor surface.

The exit aperture of the line 15 is directed onto the gold silicon eutectic 23. During treatment, the supporting means 18 and consequently also the semiconductor element 14 supported thereon are rotated about their common axis of rotation, so that the water will centrifuge from the surface thereof. The speed of rotation of the supporting means is adapted to be varied within wide limits, for example in the order of 50 to 3000 rotations per minute.

It is to be understood that other semiconductor elements consisting, for instance, of germanium, may also be treated in a similar manner, and the devices which are subjected to such treatment may also be of the transistor or four-layer device type, and the like. Generally, most semiconductor elements are of a rotation-symmetrical design, and may therefore also be rotated during treatment in the above-described manner. In cases where the electrodes are in the form of a plurality of rings on the surface of the semiconductor body, for instance in transistors, it is possible to provide for a corresponding plurality of superheated steam nozzles. However if desired it is also possible to treat the individual annular surface areas one after the other.

In lieu of superheated steam as utilized in the above-described embodiment, the invention contemplates using air or pure oxygen as an oxidizing agent. These gases are heated to a temperature of between 500° C. and 1000° C. in the case of a silicon body, and to at most 900° C. in the case of a germanium body. Here, too, heating may be effected within a furnace through which a suitable gas is made to flow. If so desired a pure hydrogen flame may be directed onto the semiconductor surface.

Substances such as water, air, nitrogen or also inert gases such as, for instance, argon may be used as cooling agents with the temperature thereof being between approximately 0° C. and 200° C.

While an embodiment of the invention has been described in detail it will be obvious to those skilled in the art that the invention may be otherwise embodied within its scope.

I claim:

1. The method for the surface treatment of a semiconductor element having a substantially monocrystalline semiconductor body and at least one metal electrode applied thereto, which comprises directing a heated jet of a fluid oxidizing agent upon the semiconductor surface, and directing another jet of a fluid cooling agent upon the electrode.

2. The method for the surface treatment of a semiconductor element having a substantially monocrystalline semiconductor body and at least one metal electrode applied thereto, which comprises directing a heated jet of a fluid oxidizing agent upon the semiconductor surface, and directing another jet of a fluid cooling agent upon the electrode, and rotating the semiconductor element around its axis of rotation while subjecting it to the jets.

3. The method for the surface treatment of a semiconductor element having a substantially monocrystalline semiconductor body and at least one metal electrode applied thereto, which comprises directing a heated jet of superheated steam onto the semiconductor surface, and directing a jet of cooling water onto the electrode.

References Cited by the Examiner

UNITED STATES PATENTS

| | | | |
|---|---|---|---|
| 2,703,767 | 3/1955 | Young | 117—37 X |
| 2,930,722 | 3/1960 | Ligenza | 148—6.3 X |
| 3,160,521 | 12/1964 | Ziegler et al. | 117—106 X |
| 3,160,522 | 12/1964 | Heywang et al. | 117—106 X |
| 3,182,361 | 5/1965 | Trimble | 117—119.2 X |

ALFRED L. LEAVITT, *Primary Examiner.*

J. R. BATTEN, JR., *Assistant Examiner.*